United States Patent [19]

Greskovich et al.

[11] 4,040,849

[45] Aug. 9, 1977

[54] POLYCRYSTALLINE SILICON ARTICLES BY SINTERING

[75] Inventors: Charles D. Greskovich; Joseph H. Rosolowski, both of Schenectady, N.Y.

[73] Assignee: General Electric Company, Schenectady, N.Y.

[21] Appl. No.: 646,968

[22] Filed: Jan. 6, 1976

[51] Int. Cl.² .................... C01B 33/02; C04B 35/16
[52] U.S. Cl. .................................. 106/73.5; 264/65; 423/348
[58] Field of Search ............... 106/73.5; 423/348, 349, 423/344; 264/56, 65

[56] References Cited

U.S. PATENT DOCUMENTS

| | | | |
|---|---|---|---|
| 2,419,237 | 4/1947 | Treuting | 423/348 |
| 3,120,451 | 2/1964 | Schmidt et al. | 423/349 |
| 3,147,141 | 9/1964 | Ishizuka | 423/349 |
| 3,212,853 | 10/1965 | Wentorf, Jr. et al. | 423/348 |
| 3,212,922 | 10/1965 | Sirtl | 423/349 |
| 3,778,231 | 12/1973 | Taylor | 423/344 |

*Primary Examiner*—Patrick P. Garvin
*Assistant Examiner*—Mark Bell
*Attorney, Agent, or Firm*—Jane M. Binkowski; Joseph T. Cohen; Jerome C. Squillaro

[57] ABSTRACT

A polycrystalline silicon body is produced by shaping silicon powder having an average particle size less than 0.2 micron into a green body and sintering the body to a density of at least 60% of the theoretical density of silicon.

8 Claims, 2 Drawing Figures

POLYCRYSTALLINE SILICON ARTICLES BY SINTERING

The invention herein described was made in the course of or under a contract or subcontract thereunder (or grant) with the Department of the Navy.

The present invention relates to a method of producing a novel sintered polycrystalline silicon body.

In silicon device technology there is a great need for inexpensive noncontaminating support material for single crystal silicon wafers undergoing the necessary diffusion and oxidation processes in a high temperature furnace. Primary requirements of the support materials are that it not contaminate nor affect the quality of the silicon wafers, and that it be strong and have good thermal shock resistance. Fused silica ($SiO_2$) has been the most widely used support material but has temperature limitations at or below 1250° C because of the problems of deformation and devitrification after long times at higher temperatures. Furthermore, and most importantly, recent investigations have shown that during high temperature processing dislocations form in the silicon wafers in the vicinity of the contact region between the wafer and the fused silica support and is related to the different thermal expansion coefficients of the silicon wafer and the fused silica. Dislocations in silicon are known to adversely affect many of the desirable properties, one of such is electrical conductivity.

In order to avoid many of the material problems with fused silica, polycrystalline silicon tubes and boats have been prepared by chemical vapor deposition (CVD). This polycrystalline silicon can be made with high purity, good strength up to 1400° C, and good thermal shock resistance. And, of course, it has the same coefficient of thermal expansion as the silicon wafers so that the formation of dislocations in the silicon wafers can be avoided. Some of the major problems with this (CVD) method are: (1) the deposition rate is usually low and therefore time consuming; (2) the deposited silicon is highly textured and is susceptible to residual mechanical stresses which cause cracking in the formed body; (3) silicon deposition usually takes place on a graphite substrate at temperatures exceeding 1000° C and the problem of SiC formation at the silicon/graphite interface must be prevented so that the formed silicon body can be easily separated from the substrate after deposition; (4) boats are made by diamond sawing appropriate sized pieces from larger circular or rectangular shaped tubes and occasionally exhibit fracture caused by residual stresses frequently found in thick-walled material.

In accordance with the present invention, novel polycrystalline silicon bodies are produced by a sintering process which is more economical than the CVD approach and eliminates many of the problems associated with the CVD approach. Specifically, in the present invention, a polycrystalline silicon body of desired density is produced by sintering a compact of silicon powder. The density of the sintered body depends on its application and can range from 60% to nearly theoretical density.

Those skilled in the art will gain a further and better understanding of the present invention from the detailed description set forth below, considered in conjunction with the figures accompanying and forming a part of the specification, in which.

Figure 1:
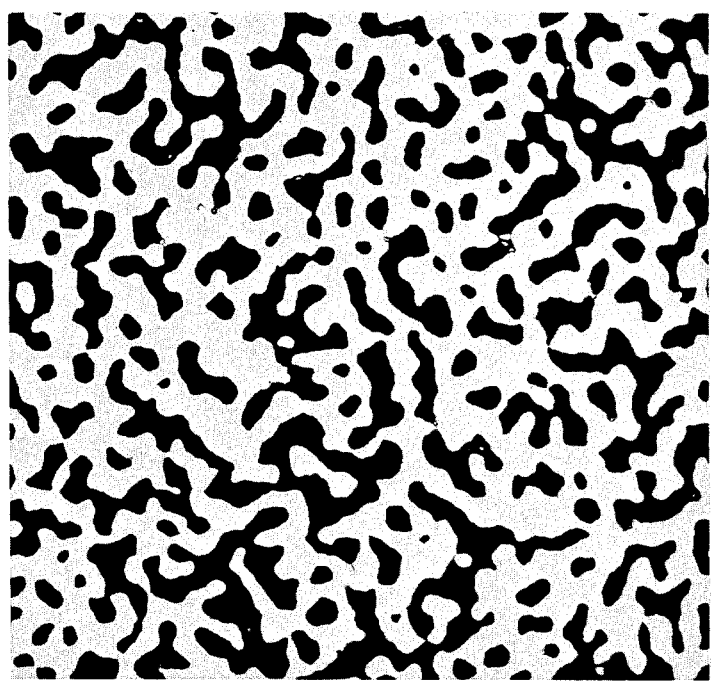
FIG. 1 is a photomicrograph (magnified 500 ×) of a sectioned and polished surface of the present sintered body having a density of 61% of the theoretical density of silicon and showing its open interconnecting pore structure.

Briefly stated, the present invention comprises shaping silicon powder having an average particle size less than 0.2 micron into a green body with a density of at least about 30% of the theoretical density of silicon and sintering the body producing a sintered body having a density of at least 60% of the theoretical density of silicon.

In the present invention, the density of the green body and that of the sintered body is given as a fractional density of the theoretical density of silicon.

Preferably, particles of pure silicon are used in the present invention. These particles may have oxygen adsorbed, or have a thin oxide film on their surfaces. Oxygen is not considered a contaminant since during heat up to sintering temperature it is eliminated as silicon monoxide before sintering is initiated and the resulting sintered product is free of oxygen or may contain oxygen in trace amount which has no significant deteriorating effect on its properties. Usually, the composition of the starting silicon powder is at least about 97% by weight pure silicon with oxygen on its surfaces up to about 3% by weight of the composition. For some applications of the sintered product, the starting silicon particles must be free of metallic and non-metallic impurities, other than the adsorbed oxygen, but for a number of product applications, the starting silicon powder may contain traces of metallic and non-metallic impurities which do not affect the sintering process or the properties of the sintered product deleteriously for the particular application. However, to insure against deleterious effects, the total amount of such impurities should not be greater than 0.05% by weight of the starting silicon powder composition.

The present fine sized starting silicon powder can be prepared by a number of techniques. One technique involves reacting silicon-containing compounds with hydrogen such as the following reactions with silicon tetrachloride and trichlorosilane:

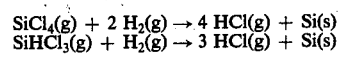

Additional techniques involve the pyrolytic decomposition of silicon-containing compounds such as the following thermal decompositions of trichlorosilane, silane, silicon tetrachloride and silicon dichloride, respectively:

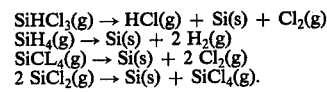

Generally, in chemical techniques used to produce the present silicon powder, lower reaction or decomposition temperatures ordinarily produce a powder which is significantly more amorphous and finer than that produced at higher temperatures. In a specific reaction or decomposition process for producing the silicon powder, modification of processing steps such as gas flow and/or temperature can be used to modify the characteristics of the silicon powder produced. The silicon powder is recoverable by a number of techniques. For example, as it is formed, it can be deposited on a suitable substrate such as a silica tube from which it can be scraped or it can be caught in a trap and recovered therefrom. The silicon powder may contain particulate impurities but it can be purified by conventional methods such as by leaching with an appropriate acid such as hydrofluoric acid, a mixture of hydrofluoric and nitric acids, or aqua regia.

The present silicon powder can range in structure from amorphous to crystalline. Preferably, it is amorphous or poorly crystalline, as determined by X-ray diffraction analysis and differential thermal analysis, since shrinkage or densification ordinarily increases with increasing amorphism of the starting powder under identical experimental conditions. In the present invention, a poorly crystalline silicon powder is one having a crystallinity content less than about 50% by volume of the powder.

The present silicon powder has an average particle size of less than 0.2 micron. Silicon powder having an average particle size of 0.2 micron or larger is not useful because it cannot be densified by sintering to a density of 60%. Silicon powder having an average particle size less than 0.1 micron is preferred since it provides a larger surface area, and the larger the surface area, the greater is shrinkage or densification of the body during sintering.

A number of techniques can be used to shape the silicon powder into a green body. For example, the silicon powder can be extruded, injection molded, die-pressed, isostatically pressed or slip cast to produce the green body of desired shape. Any lubricants, binders or similar materials used in shaping the powder should have no significant deteriorating effect on the properties of the green body or the resulting sintered body and should be completely or substantially completely removable such as by vaporization or leaching before sintering is initiated. Such materials are preferably of the type which evaporate on heating at relatively low temperatures, preferably below 400° C, leaving no significant residue.

The density of the green body can range from about 30% to the maximum attainable, which is generally about 60%. The higher the green density, the greater is the final density achievable in the sintered product. Specifically, the green density should be at least 30% to produce a sintered product having a density of at least 60% and a green density of at least 40% is required to produce a sintered product having a density substantially higher 60%.

In the present process, since amorphous silicon powder is significantly more sinterable than crystalline silicon powder, and since the finer the powder the more it shrinks during sintering, a green body having a density ranging from 30% to 35% should preferably be composed of silicon powder which is amorphous or poorly crystalline and which has an average particle size less than 0.1 micron to produce a sintered product having the required density of at least 60%. As the density of the green body is increased, silicon powder of correspondingly higher crystallinity content and particle size can be used, and in a green body having a density of at least 40%, completely crystalline silicon powder ranging up to a particle size less than 0.2 micron is sinterable to a density of at least 60%. However, to produce a sintered product having a density ranging from 92% to 100%, the green body must have a density of at least 40% and the starting silicon powder should be amorphous or poorly crystalline.

Sintering is carried out at a temperature ranging from 1250° C to below the melting point of silicon which is about 1410° C. As a practical matter sintering temperature ranges from 1300° C to about 1400° C and preferably from 1350° C to 1380° C to increase the rate of sintering but remain safely below the melting point of silicon. The particular sintering temperature is determinable empirically and depends largely on particle size, density of the green body, and final density desired in the sintered product with higher final densities requiring higher sintering temperatures. Specifically, the smaller the size of the particles in the green body and the higher its density, the lower is the required sintering temperature. Sintering temperatures lower than 1250° C do not produce the present sintered bodies with a density of at least 60%.

Sintering of the green body is carried out in an atmosphere in which it is substantially inert, i.e. an atmosphere which has no significant deteriorating effect on its properties such as, for example, argon, helium or a vacuum. The sintering atmoshere can range from a substantial vacuum to atmospheric pressure, but as a practical matter, it is preferably at atmospheric pressure. Preferably, the sintering atmosphere is a flowing atmosphere. However, generally for relatively small pieces, the present sintering can be carried out in stagnant atmospheres or in closed systems.

One preferred embodiment of the present invention comprises shaping silicon powder having an average particle size ranging from 0.05 micron to 0.1 micron into a green body having a density of at least 40% and sintering the body at a temperature ranging from 1300° C to 1400° C to produce a sintered product having a density of at least 92% or higher and wherein substantially all the pores are closed pores.

The polycrystalline sintered body of the present invention consists essentially of silicon and has a density of at least 60%. The grains and pores of the sintered body are usually of about the same size. The silicon grains are equiaxed or substantially equiaxed and have an average grain size ranging up to about 6 microns. The grains are of significantly or substantially uniform size and are distributed at least significantly or at least substantially uniformly throughout the sintered body. The pores, have an average size, i.e., pore diameter, ranging up to about 6 microns and are of significantly or substantially uniform size and are distributed at least significantly or at least substantially uniformly throughout the body.

The particular average grain size of the sintered body depends largely on the average particle size of the starting powder, the density of the green body and sintering temperature. Generally, the polycrystalline sintered body has an average grain size and an average pore size of about 1 micron or smaller. Specifically, silicon powder having an average particle size less than 0.1 micron shaped into a green body having a density of at least 30% produces a sintering product having an average grain size as well as an average pore diameter of about 0.5 micron or smaller, i.e. as small as about 0.1 micron, when the sintering temperature is not higher than 1375° C. On the other hand, silicon powder having an average particle size ranging from 0.1 micron to less than 0.2 micron shaped into a green body having a density of at least 40% and sintered at a temperature ranging from about 1350° C to a temperature below the melting point of silicon produces a sintered product having an average grain size and average pore size ranging from 1 micron to 6 microns.

When the present polycrystalline sintered body has a density ranging from 60% to about 85%, substantially all or a major portion of the pores are interconnecting with interconnectivity decreasing with increasing density. As the density of the sintered body exceeds 85%, the interconnectivity of the pores decreases substantially, and at a density of about 92% or higher all or substantially all of the residual pores are closed.

Polycrystalline sintered bodies of the present invention having a density of at least about 92% and wherein all or substantially all of the residual pores are closed are gas tight and substantially stable in a number of atmospheres at elevated temperatures such as, for example, oxidizing atmospheres at temperatures ranging up to the melting point of the silicon.

The present invention provides a number of advantages. For example, with standard power processing techniques, large shapes (plates, disks, boats, crucibles, tubes) and sizes can be fabricated during the powder compaction step before sintering so that machining costs are minimized or virtually absent.

The present invention makes it possible to fabricate complex shaped articles of polycrystalline silicon directly which heretofore could not be manufactured or required expensive machining because of the complex geometries desired of the material. Specifically, the present sintered product can be made in the form of a useful shaped article such as an impervious crucible, a thin walled tube, a long rod, a spherical body, or a hollow shaped article. The dimensions of the present sintered product differ from those of its green body by the extent of shrinkage, i.e. densification, which occurs during sintering. Also, the surface characteristics of the sintered body depend on those of the green body from which it is formed, i.e. it has a substantially smooth surface if the green body from which it is formed has a smooth surface.

The sintered products of the present invention are polycrystaline wherein the grains are randomly oriented. Specifically, when the present products are cross-sectioned and polished and the polished surfaces subjected to an X-ray beam, they give a typical X-ray diffraction pattern which corresponds with a random arrangement of silicon crystals designated in the ASTM card file. It is random because the relative intensities of the peaks observed in the X-ray diffraction pattern of the present products corresponds directly with the known ASTM card file of silicon showing that it is random and polycrystalline. In contrast to preferred grain orientation, the random orientation of the grains of the present product enables it to have significantly less residual stress, and therefore, higher mechanical strengths.

The present polycrystalline sintered body in the lower density range is particularly useful for forming dense silicon nitride as disclosed in copending U.S. patent application Ser. No. 646,764 entitled "Si$_3$N$_4$ Formed By Nitridation Of Sintered Silicon Compact" filed of even date herewith in the names of Charles D. Greskovich and Svante Prochazka and assigned to the assignee hereof. Specifically, in this copending application, gaseous nitrogen is passed through the interconnecting pores of the sintered body ranging in density from 60% to about 75% and reacted with the silicon to form a dense body of Si$_3$N$_4$.

In the present invention green bodies having a density higher than 58% should be densified during sintering by at least 2% to produce a sintered body with a minimum density higher than 60%. For example, a 60% dense green body should be sintered to a density of at least 62%. Such densification is necessary to get sufficient development of the microstructure for satisfactory reaction with nitrogen in copending U.S. patent application Ser. No. 646,764. Specifically, in addition to imparting significant mechanical strength to the body, such densification rounds off the pores and makes them more uniform in size and more uniformly distributed throughout the body permitting nitrogen gas to be transported and permeated throughout the body substantially more uniformly and at a rate substantially faster than that in the unsintered compact or green body where the pores are more non-uniform and irregularly shaped and frequently non-uniformly distributed in the body thereby retarding the rate of penetration of nitrogen gas into the interior of the compact. Such retardation of nitrogen causes sufficient formation of silicon nitride to block the pores in the outer surface areas of the body before the nitrogen can reach the central portion of the body thereby leaving a significant or substantial fraction of the silicon unreacted.

The present polycrystalline sintered body having a density ranging from about 75% to 92% is useful as a support material in the processing of single crystal silicon wafers when the atmosphere used is, for example, a vacuum or a flowing inert atmosphere so that any gases adsorbed on the surfaces of interconnecting pores would be removed before the required high temperature was reached to prevent contamination of the wafers. The 75% to 92% dense body is also useful for forming a composite by reaction of its outer exposed surface with gaseous nitrogen to produce a zone of silicon nitride which substantially encapsulates the sintered body. Such a composite is also useful as a support material for single crystal silicon wafers.

The sintered bodies with a density higher than 92% of the theoretical density of silicon have applications (1) in the silicon semiconductor industry as high purity, high strength tubes and boats and other support material for single crystal silicon wafers during high temperature diffusion and oxidation processes, and (2) as high purity, polycrystalline silicon rods used as stock material from which single crystal silicon is grown by the floating zone method, and (3) as crucibles, containers and reaction chambers for very corrosive liquids such as acids, alkalies and sulfides at room temperature or elevated temperature in reducing, oxidizing and neutral atmospheres or vacuum.

EXAMPLES

For Examples 1 and 3 of Table I, the crystalline silicon powder was prepared by crushing a high purity, single crystal boule of silicon with a Cu mortar and pestle followed by sieving through a −325 mesh brasss screen, leaching in aqua regia to remove metal contamination, washing with distilled water, and drying. This powder was fed into a jet mill and the fines collected. The structure of the collection system was slightly modified to permit powders, with an average particle size of 1.35 and 0.23 $\mu$, to be collected in different regions. Typical chemical analysis of these powders showed them to be greater than 99.5% by weight pure silicon the major impurities (in ppm) being O (2000), B (300), Cu (100), Fe (100) and Ni (100). Scanning Electron Microscope (SEM) photomicrographs showed that the powder particles were angular and nonagglomerated.

In the remaining Examples of Table I, the silicon powder was prepared by the thermal decomposition of silane, SiH$_4$, between 600° C and 700° C in a gradient furnace comprised of an open-ended fused silica tube passing through a furnace. The following reaction takes place:

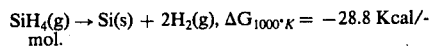

The source of silane was a 4% silane + 96% helium "calibration mixture". This gaseous mixture was flowed into the tube most of which, except for the open end portions, was located inside the furnace. The tube was thoroughly flushed with argon before the introduction of the gaseous mixture into the hot tube. The silicon powder (or smoke) deposited on the inner wall of the tube. The powder was scraped from the wall and characterized by X-ray diffraction and SEM analyses, surface area measurements and sintering experiments.

Two experimental runs were made, and silicon powders prepared from these runs were designated Si-1 and Si-2. Si-1 powder was prepared by using a gas flow rate of 0.5 standard cubic feet per hour (SCFPH) and a maximum furnace temperature of 700° C. Si-2 powder was prepared with a gas flow rate of 2 SCFPH and a maximum furnace temperature of 650° C. The color of Si-1 powder was dark brown. Si-2 powder was inhomogeneously brownish-grey in color. Since the powders were prepared in a temperature gradient furnace, these powders were believed to be inhomogeneous with respect to particle size, morphology and crystallinity. Therefore, a portion of each powder was given an isothermal anneal at 700° C in flowing argon for 60 minutes. After the annealing treatment, the color of the Si-1 powder turned light brown while that of Si-2 powder turned dark brown to yellowish brown. X-ray diffraction analysis of these powders showed that Si-1 powder was amorphous in the "as-prepared" form but partly or poorly crystallized after the isothermal anneal at 700° C. Preliminary X-rays results on Si-2 powder show it to be partly or poorly crystalline in the "as-prepared" state as well as in the annealed state after the isothermal treatment at 700° C. All of the powders were greater than 99.5% by weight pure silicon with the major impurity being oxygen.

The amorphous "as-prepared" Si-1 powder was used in Examples 4 to 8. The annealed, poorly crystallized Si-2 powder was used in Example 2.

Powder compacts were preshaped from each powder without binders into disks in a double-acting carboloy die at 5000 psi and then hydrostatically pressed at 30,000 psi. Their green densities are shown in Table I. Specifically, in Examples 2 and 4 about 0.2 gram of silicon powder was used resulting in disks of about 0.8 cm in diameter and 0.3 cm in thickness. In each of the remaining examples, about 1 gram of silicon powder samples were used resulting in disks of about 1.5 cm in diameter and 0.7 cm in thickness. The disks, i.e. green bodies, were sintered for 60 minutes at the sintering temperatures shown in Table I. In Examples 1 to 6 the sintering atmosphere was flowing prepurified argon using a gas flow rate of 2 SCFPH, and the sintering treatment was done in a platinum wound resistance furnace having an Al$_2$O$_3$ insert tube. The sintering treatment in Example 8 was carried out in the same manner as in Examples 1 to 6 exept that wet argon having a dew point of 25° C was used. In Example 7, sintering was carried out in stagnant argon in a fused silica ampule which was filled with argon and the disk sealed in the ampule and then sintered. The results are shown in Table I. In Table I, Linear Shrinkage $\Delta L/L_o(\%)$ is the difference in length between the green body and the sintered body, $\Delta L$, divided by the length of the green body $L_o$.

TABLE I

| | SILICON POWDER | | | Green | Sintering | SINTERED PRODUCT | | | | |
| | | | | Density | Temp. | Density | Linear Shrinkage $\frac{\Delta L}{L_o}$ (%) | Average Grain Size | Average Pore Size | |
| Ex. | Structure | Surface Area (m²/g) | Average Particle Size (μ) | (%) | (° C) | (%) | | (micron) | (micron) | Microstructure |
|---|---|---|---|---|---|---|---|---|---|---|
| 1 | Crystalline | 11 | 0.23 | 54 | 1350 | 58.5 | 2.4 | 4 | 3 | Uniform. Pore-free polycrystalline solid regions spaced by interconnected pores (open porosity). |
| 2 | Poorly crystalline | 15 | 0.17 | 48 | " | 61 | 5 | 3–4 | 6 | Substantially similar to Example 1. |
| 3 | Crystalline | 2 | 1.3 | 55 | " | 55 | ~0 | 2.5 | 3 | Similar to Example 1 but structure is non-uniform. |
| 4 | Amorphous | 44 | 0.06 | 43 | 1280 | 70 | 15 | 0.2 | 0.2 | Fine equiaxed pore-grain structure. Uniform. Open porosity. |
| 5 | " | " | " | " | 1350 | 92 | 22.4 | ~0.4 | ~0.4 | Equiaxed pore-grain structure. All pores on grain boundaries and are closed. Uniform. |
| 6 | " | " | " | " | 1375 | 98.5 | 24.2 | ~0.5 | ~0.5 | " |
| 7 | " | " | " | " | " | " | " | " | " | " |
| 8 | " | " | " | " | " | 92 | 22 | " | " | 50 to 100 micron thick glassy layer encapsulating a 92% dense polycrystalline silicon body having a microstructure composed of fine, equiaxed pores and grains <0.5 μ in size. Partial microcracking. |

Figure 2:
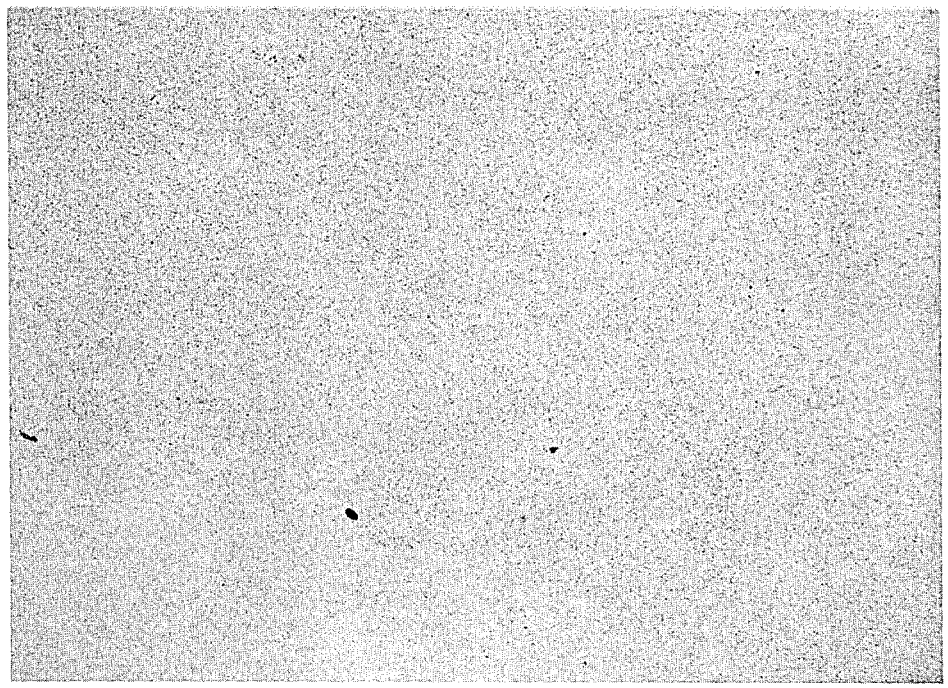
FIG. 2 is a photomicrograph (magnified 500 ×) of a sectioned and polished surface of the present sintered body having a density of 92% of the theoretical density of silicon showing its uniform dense microstructure with closed pores.

In Table I, Examples 2 and 4 to 8 illustrate the present invention. Specifically, in Examples 1 and 3, the silicon powder particles were too large and completely crystalline to sinter sufficiently, and the powder in Example 3 also resulted in a non-uniform microstructure. However, in Example 2, the powder was poorly crystalline and had a sufficiently small particle size and was formed into a green body of sufficient density to produce a sintered body with a density of at least 60% and a substantially uniform microstructure which is illustrated in FIG. 1. The light portions of FIG. 1 are interconnecting grains and the dark portions are interconnecting pores. The microstructure of the sintered product of Example 5 is shown in FIG. 2.

In Example 8 the wet argon atmosphere did not prevent satisfactory densification of the compacted silicon powder. If desired, the encapsulating glassy layer, which is a silica layer formed by reaction of silicon with the gaseous atmosphere, can be dissolved off with hydrofluoric acid leaving the present polycrystalline silicon sintered product which had a density of 92%.

The sintered products of Table I were examined in a standard metallographic manner.

The sintered products of Examples 2 and 4 to 7, which illustrate the present invention, did not exhibit any evidence of microcracks or residual stresses. That of Example 8 did show some microcracking. The sintered products of Examples 2 and 5 were cross-sectioned, polished and the polished surfaces subjected to X-ray diffraction analysis and chemical etching experiments and were determined to be polycrystalline with randomly oriented grains.

The annealed Si-1 powder was used to prepare a sintered product in the same manner as set forth for Examples 5 and 6 and produced sintered products substantially the same as those of Examples 5 and 6.

In copending U.S. patent application Ser. No. 646,969 entitled "Polycrystalline Silicon Articles Containing Boron By Sintering" filed of even date herewith in the names of Charles D. Greskovich and Joseph H. Rosolowski and assigned to the assignee hereof, there is disclosed a polycrystalline silicon body produced by shaping a particulate mixture of silicon and boron into a green body and sintering the body to a density of at least 60% of the theoretical density of silicon.

In copending U.S. patent application Ser. No. 646,764 entitled "$Si_3N_4$ Formed By Nitridation Of Sintered Silicon Compact" filed of even date herewith in the names of Charles D. Greskovich and Svante Prochazka and assigned to the assignee hereof, there is disclosed a dense polycrystalline silicon nitride body produced by nitridation of a polycrystalline sintered silicon article of certain density.

In copending U.S. patent application Ser. No. 646,967, entitled "$Si_3N_4$ Formed By Nitridation Of Sintered Silicon Compact Containing Boron" filed of even date herewith in the names of Charles D. Greskovich and Svante Prochazka and assigned to the assignee hereof, there is disclosed a dense polycrystalline silicon nitride body produced by nitridation of a polycrystalline sintered silicon article containing boron of certain density.

What is claimed is:

1. A process for producing a polycrystalline sintered body of silicon which comprises shaping silicon powder having an average particle size less than 0.1 micron into a green body having a density of at least 30% of the theoretical density of silicon, said powder having a structure ranging from amorphous to crystalline, and sintering the green body at a temperature ranging from 1250° C to a temperature below the melting point of silicon in an atmosphere which has no significant deteriorating effect on the green body or the resulted sintered body to produce a sintered body having a density of at least 60% of the theoretical density of silicon, said sintering densifying said green body in an amount of at least 2%.

2. A process for producing a polycrystalline sintered body of silicon which comprises shaping silicon powder having an average particle size less than 0.2 micron into a green body having a density of at least 40% of the theoretical density of silicon, and sintering the green body at a temperature ranging from 1250° C to a temperature below the melting point of silicon in an atmosphere which has no significant deteriorating effect on the green body or the resulting sintered body to produce a sintered body having a density of at least 60% of the theoretical density of silicon, said sintering densifying said green body in an amount of at least 2%.

3. A process for producing a polycrystalline sintered body of silicon according to claim 2 wherein said silicon powder has an average particle size less than 0.1 micron and said sintering temperature ranges from 1300° C to 1400° C.

4. A process for producing a polycrystalline sintered body of silicon according to claim 2 wherein said silicon powder has an average particle size ranging from 0.1 to less than 0.2 micron and said sintering temperature ranges from about 1350° C to below the melting point of the silicon.

5. A polycrystalline densified sintered body consisting essentially of silicon having a density of at least 60% of the theoretical density of silicon, said sintered body having an average grain size and an average pore size of about one micron or smaller, said silicon grains and pores being of significantly uniform size and being distributed significantly uniformly throughout said body, said silicon grains being substantially equiaxed.

6. A polycrystalline sintered body of silicon according to claim 5 wherein said density ranges from 60% to about 75% of the theoretical density of silicon and wherein at least a major portion of the pores are interconnecting.

7. A polycrystalline sintered body of silicon according to claim 5 wherein the density is at least 92% of the theoretical density of silicon and wherein all or substantially all of the residual pores are closed pores.

8. A polycrystalline densified sintered body consisting essentially of silicon having a density ranging from 60% to 75% of the theoretical density of silicon, said sintered body having an average silicon grain size and an average pore size ranging from 1 micron to 6 microns, said silicon grains and pores being of significantly uniform size and being distributed significantly uniformly throughout said body, said silicon grains being substantially equiaxed.

* * * * *